(12) United States Patent
Chiu

(10) Patent No.: US 8,808,494 B2
(45) Date of Patent: Aug. 19, 2014

(54) BONDING MATERIAL, METHOD, AND STRUCTURE

(75) Inventor: Kuo-Chuang Chiu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 305 days.

(21) Appl. No.: 13/283,490

(22) Filed: Oct. 27, 2011

(65) Prior Publication Data

US 2012/0107631 A1    May 3, 2012

(30) Foreign Application Priority Data

Nov. 2, 2010   (TW) .............................. 99137590 A

(51) Int. Cl.
| | | |
|---|---|---|
| *B32B 15/04* | (2006.01) | |
| *B32B 15/20* | (2006.01) | |
| *B32B 37/06* | (2006.01) | |
| *B32B 37/14* | (2006.01) | |
| *B32B 18/00* | (2006.01) | |
| *B32B 37/12* | (2006.01) | |
| *C08L 1/00* | (2006.01) | |
| *C08K 3/22* | (2006.01) | |
| *C04B 35/636* | (2006.01) | |
| *C04B 37/02* | (2006.01) | |
| *C04B 35/634* | (2006.01) | |
| *B82Y 30/00* | (2011.01) | |
| *H01L 33/64* | (2010.01) | |

(52) U.S. Cl.
CPC ........... *C04B 37/028* (2013.01); *C04B 2237/60* (2013.01); *C04B 2235/5445* (2013.01); *C04B 2235/5454* (2013.01); *C04B 2235/9607* (2013.01); *C04B 2237/407* (2013.01); *C04B 2237/72* (2013.01); *C04B 35/6365* (2013.01); *C04B 37/025* (2013.01); *H01L 33/641* (2013.01); *C04B 35/63416* (2013.01); *C04B 2237/064* (2013.01); *C04B 2237/708* (2013.01); *C04B 2237/348* (2013.01); *C04B 2237/06* (2013.01); *C04B 2235/3281* (2013.01); *C04B 2237/366* (2013.01); *B82Y 30/00* (2013.01); *C04B 2237/068* (2013.01); *C04B 35/6342* (2013.01); *C04B 2237/592* (2013.01); *C04B 2237/343* (2013.01); *C04B 2237/08* (2013.01)
USPC ...................... 156/327; 106/204.01; 524/413

(58) Field of Classification Search
None
See application file for complete search history.

(56) References Cited

U.S. PATENT DOCUMENTS

| | | |
|---|---|---|
| 4,563,383 A | 1/1986 | Kuneman et al. |
| 5,418,002 A | 5/1995 | Paik et al. |
| 5,490,627 A | 2/1996 | Krum et al. |

(Continued)

FOREIGN PATENT DOCUMENTS

| | | |
|---|---|---|
| CN | 1364748 | 8/2002 |
| CN | 101049056 | 10/2007 |

(Continued)

OTHER PUBLICATIONS

Matsukawa et al. Physica C:, 317-318, 1999, 600-602.*
Lai et al. Nanotechnology, 21, 2010, 295601.*
Position Paper on Energy Efficiency—the Role of Power Electronics, Mar. 2007, 18 pages, EPE, Germany.

(Continued)

*Primary Examiner* — Vera Katz

(57) ABSTRACT

Disclosed is a bonding structure, including a heat dissipation substrate, a eutectic layer on the heat dissipation substrate, and a copper layer on the eutectic layer. The thermal dissipation substrate includes aluminum oxide, aluminum nitride, or zirconium oxide. The eutectic layer includes aluminum oxide, aluminum nitride, or zirconium oxide doped with zinc, tin, indium, or combinations thereof.

8 Claims, 2 Drawing Sheets

(56) References Cited

U.S. PATENT DOCUMENTS

| | | | |
|---|---|---|---|
| 5,938,104 | A | 8/1999 | Saxelby, Jr. et al. |
| 6,569,514 | B2 | 5/2003 | Naba et al. |
| 6,812,191 | B2 * | 11/2004 | Park et al. ............ 505/121 |
| 2002/0060091 | A1 | 5/2002 | Naba et al. |

FOREIGN PATENT DOCUMENTS

| | | | |
|---|---|---|---|
| CN | 101456726 A * | 6/2009 | |
| CN | 101747073 | 6/2010 | |
| CN | 101923911 A * | 12/2010 | |
| JP | 60-033361 | 2/1985 | |
| TW | 200835431 | 8/2008 | |
| WO | WO 9400385 A1 * | 1/1994 | |

OTHER PUBLICATIONS

Kenneth Kelly, "Characterization and Development of Advanced Heat Transfer Technologies," DOE Vehicle Technologies Annual Merit Review, May 2009, 17 pages, NREL, US.

Thomas Abraham et al., "Advanced Thermal Control Enabling Cost Reduction for Automotive Power Electronics," Sep. 2008, 25 pages, NREL, US.

M. Ray Fairchild et al., "Emerging Substrate Technologies for Harsh-Environment Automotive Electronics Applications", Mar. 2002, 10 pages, SAE 2002 World Congress, US.

Sujit Das et al. "The Cost of Silicon Nitride Powder: What Must It Be to Complete?", Feb. 1992, 62 pages, Oak Ridge National Laboratory, US.

Taiwan Patent Office, Office Action, Patent Application Serial No. 099137590, May 10, 2013, Taiwan.

* cited by examiner

BONDING MATERIAL, METHOD, AND STRUCTURE

CROSS REFERENCE TO RELATED APPLICATIONS

This application claims priority of Taiwan Patent Application No. 099137590, filed on Nov. 2, 2010, the entirety of which is incorporated by reference herein.

BACKGROUND

1. Field

The disclosure relates to a bonding structure, and in particular relates to a bonding material and a bonding method for bonding a copper sheet to a heat dissipation substrate.

2. Description of the Related Art

Improving upon heat dissipation has reached a bottleneck for modulating a high heat generating device. Conventional FR4 substrates or aluminum-based metal substrates cannot conduct heat from a device to a heat dissipation device due to their low thermal conductivities. The described problem can be overcome by combining a copper sheet with an electrically insulative ceramic substrate to conduct the heat from a device to the heat dissipation device. The composite plate is the so-called direct bonded copper (DBC).

Although DBC may solve the heat dissipation problem, it is often processed at a temperature of over 1000° C. For forming a eutectic layer between the copper sheet and the ceramic substrate, the copper sheet should be firstly oxidized to form a copper oxide layer to bond with the ceramic substrate. Controlling uniformity and thickness of the copper oxide layer is difficult, thus, often, non-uniform heat dissipation results. If the copper layer needs to be patterned, an additional patterning process such as lithography and etching will be performed.

Accordingly, a novel method for bonding the copper sheet and the thermal dissipation substrate is called-for.

BRIEF SUMMARY

One embodiment of the disclosure provides a bonding material, comprising: an organic polymer; and an inorganic powder averagely dispersed in the organic polymer, wherein the organic polymer and the inorganic powder have a weight ratio of 50:50 to 10:90, and wherein the inorganic powder comprises copper oxide averagely mixed with a dopant, wherein the copper oxide and the dopant have a molar ratio of 99.5:0.5 to 99.9:0.1, and the dopant is zinc, tin, indium, or combinations thereof.

One embodiment of the disclosure provides a bonding method, comprising: bonding a heat dissipation substrate and a copper layer by the described bonding material; and heating the bonding material, such that the inorganic powder of the bonding material, a part of the heat dissipation substrate, and a part of the copper layer form a eutectic layer.

One embodiment of the disclosure provides a bonding structure, comprising: a heat dissipation substrate; a eutectic layer on the heat dissipation substrate; and a copper layer on the eutectic layer, wherein the heat dissipation substrate comprises aluminum oxide, aluminum nitride, or zirconium oxide, and the eutectic layer comprises copper aluminum oxide, copper aluminum oxynitride, or copper zirconium oxide doped with zinc, tin, indium, or combinations thereof.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

One embodiment provides a bonding material including an organic polymer and an inorganic powder. The organic polymer can be PVB, PVA, methyl cellulose, other suitable organic polymers, or combinations thereof. In one embodiment, the organic polymer has a viscosity of 300 cps to 10000 cps. An organic polymer having an overly high viscosity may form an overly thick coating and cannot be averagely coated onto a heat dissipation substrate. An organic polymer having an overly low viscosity cannot be adhered onto a heat dissipation substrate. In one embodiment, the organic polymer has a weight average molecular weight of 8000 to 20000. An organic polymer having an overly high weight average molecular weight easily leaves carbon after heating. An organic polymer having an overly low weight average molecular weight will form a film of low strength, wherein the film easily peels after being coated onto a heat dissipation substrate. The inorganic powder includes copper oxide averagely mixed with a dopant. The dopant is zinc, tin, indium, or combinations thereof. The copper oxide and the dopant have a molar ratio of 99.5:0.5 to 99.9:0.1. A dopant having an overly high doping ratio may increase material costs without obviously decreasing bonding temperatures, and may further make bonding interference brittle. A dopant having an overly low doping ratio cannot efficiently decrease bonding temperatures. The copper oxide and the dopant are averagely mixed to form the inorganic powder having a diameter distribution of 20 nm to 300 nm. The diameter distribution of the inorganic powder helps the inorganic powder to be averagely dispersed in the organic polymer. In addition, a dispersant may further help the inorganic powder to be averagely suspended rather than precipitated in the colloid. An inorganic powder having an overly large diameter may increase the temperature when forming a eutectic layer. An inorganic powder having an overly small diameter is difficult to be dispersed in the organic polymer. Thereafter, the inorganic powder is averagely dispersed in the organic polymer to form a bonding material by ball grinding, stirring, or high speed centrifuge. The organic polymer and the inorganic powder have a weight ratio of 50:50 to 10:90. An inorganic powder having an overly high ratio will make the bonding material have too high a viscosity for coating. An inorganic powder having an overly low ratio will make the bonding material difficult to be formed into a film having a sufficient thickness. The bonding material can be gel or liquid, which depends on the type of process used.

Figure 1:
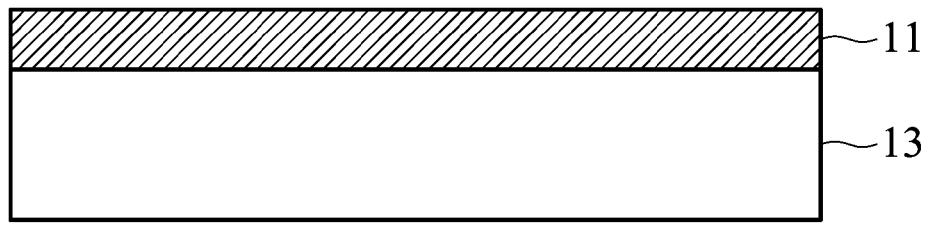
FIGS. 1-3 show a process of forming a bonding structure in one embodiment of the disclosure.

As shown in FIG. 1, the bonding material 11 is coated on a heat dissipation substrate 13 by spin coating, inkjet printing, slit die coating, dip coating, or combinations thereof. The heat dissipation substrate 13 can be a ceramic material such as aluminum oxide, aluminum nitride, zirconium oxide, or other materials which may combine with copper oxide to form a eutectic layer.

Figure 2:
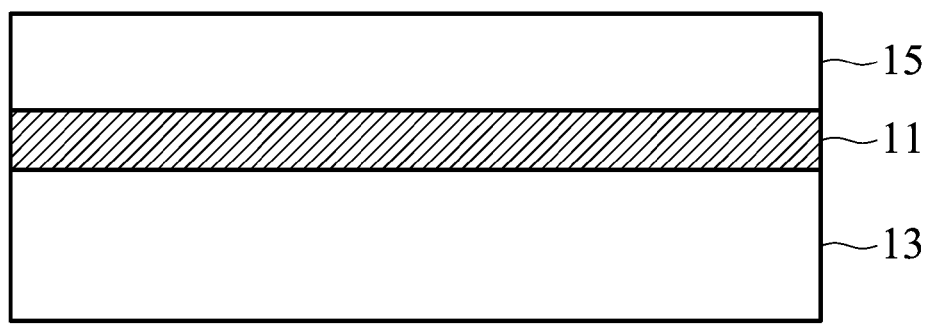

As shown in FIG. 2, a copper layer 15 is then formed on the bonding material 11. In one embodiment, the copper layer 15 has a thickness of 100 μm to 500 μm. The copper layer 15 is used to support and bond to a heat generating device such as an LED, IC, or the likes. The heat generating device can be bonded to the copper layer by flip-chip, wire bonding, other known bonding methods, or future developed bonding methods. An overly thin copper layer easily deforms. An overly thick copper layer has low adhering strength and non-average interference with the bonding material.

Figure 3:
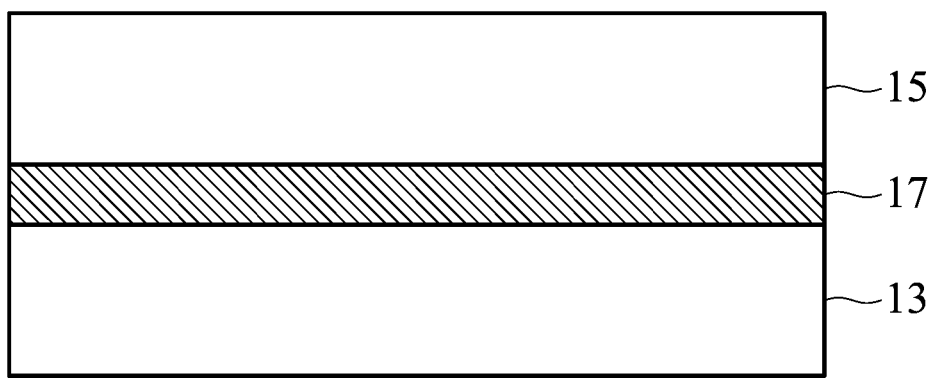

As shown in FIG. 3, the described structure is heated, such that the inorganic powder of the bonding material 11, the surface of the heat dissipation substrate 13, and the surface of the copper layer 15 form a eutectic layer 17. In one embodiment, the heating step of forming the eutectic layer 17 is performed at a temperature of 950° C. to 1000° C. In another embodiment, the heating step of forming the eutectic layer 17 is performed at a temperature of 950° C. to 980° C. Compared to conventional art, the heating step of forming the eutectic layer 17 in the disclosure is performed at a lower temperature, thereby efficiently saving energy and decreasing safety risk. As such, description of a bonding structure of the disclosure is completed. In some embodiments, the heating step not only forms the eutectic layer 17, but also removes the organic polymer in the bonding material 11. In other embodiments, additional steps can be introduced before the heating step to remove the organic polymer in the bonding material 11. The additional steps include low temperature baking to form a film (60° C. to 120° C.), middle temperature degreasing (200° C. to 500° C.), and high temperature fusion (600° C. to 1100° C.).

In one embodiment, the heat dissipation substrate 13 is aluminum oxide ($Al_2O_3$), and the eutectic layer 17 is copper aluminum oxide ($CuAl_2O_4$) doped with zinc, tin, indium, or combinations thereof. In another embodiment, the heat dissipation substrate 13 is aluminum nitride (AlN), and the eutectic layer 17 is copper aluminum oxynitride (CuAlNO) doped with zinc, tin, indium, or combinations thereof. In a further embodiment, the heat dissipation substrate 13 is zirconium oxide ($ZrO_2$), and the eutectic layer 17 is copper zirconium copper oxide ($CuZrO_3$) doped with zinc, tin, indium, or combinations thereof.

The described eutectic layer 17 can be analyzed by a chip test to determine its thickness of 1 μm to 20 μm. The thickness of the eutectic layer 17 is controlled by the thickness of the bonding material 11. An overly thin eutectic layer or a bonding material has low adhering strength with the copper layer and/or the heat dissipation substrate. An overly thick eutectic layer or a bonding material has low heat dissipation property.

In one embodiment, a heat generating device on the copper layer may endure a high temperature. As such, one side of the copper layer 15 can be firstly bonded to the heat generating device, and the other side of the copper layer can be then disposed onto the bonding material 11. In another embodiment, the described bonding structure is firstly formed, and the heat generating device is then bonded onto the copper layer 15. It should be understood that the copper layer 15 and the bonding material 11 belong to different processes, and the copper layer 15 adhered onto the bonding material 11 can be a continuously layered structure or a discontinuous pattern. Compared to the conventional art, a discontinuous pattern of the copper layer 15 can be directly adhered onto the bonding material 11 without the risk of damaging the eutectic layer 17 due to an etching process for patterning the copper layer 15.

In one embodiment, heat generated by a device on the copper layer 15 can be directly dissipated to surrounding areas through the copper layer 15, the eutectic layer 17, and the heat dissipation substrate 13. In some embodiments, other heat dissipation devices such as a fan, thermal pipe, or other heat dissipation devices, or combinations thereof can be set under the heat dissipation substrate 13 to further accelerate the heat dissipation effect.

EXAMPLE

Comparative Example 1

40 g of copper oxide nanoparticles formed by a chemical method were dispersed in 60 g of organic polymer slurry (BP series binder, commercially available from Exojet Technology Corporation) to form a bonding material. The chemical method firstly dispersed metal ions in a polymer solution, wherein the concentrations of the metal ions were exactly controlled to correspond to metal ratios of a desired composition. The metal ions were adsorbed by a chelate to form a metal complex, which was then degraded by heating to from a nano oxide. The copper oxide nanoparticles were dispersed in the organic slurry by a three-roller mill (EXAKT-35, commercially available from KOENEN) at an operation speed of 2 l/h to 3 l/h for 30 minutes to 120 minutes. The bonding material was then spin coated on an aluminum oxide substrate (96% aluminum oxide with a thermal conductivity of 20 W/mK, commercially available form LEATEC Fine Ceramics Co., Ltd), and a copper foil having a thickness of 300 μm was then adhered to the bonding material. The described structure was heated, such that the bonding material, a part of the copper foil contacting the bonding material, and a part of the aluminum oxide substrate contacting the bonding material formed a eutectic layer having a thickness of 0.5 μm to 3 μm. The final bonding structure had a thermal conductivity of 40 W/mK, and the heating step of forming the eutectic layer was performed at a temperature of about 1020° C.

Example 1-1

Example 1-1 was substantially similar to Comparative Example 1, and the difference therebetween was that the copper oxide nanoparticles in Example 1-1 were doped with 0.1 mole % zinc. The final bonding structure in Example 1-1 had a thermal conductivity of 38 W/mK (higher than that of the aluminum oxide substrate), and the heating step of forming the eutectic layer having a thickness of 0.5 μm to 3 μm was performed at a temperature of about 980° C.

Example 1-2

Example 1-2 was substantially similar to Comparative Example 1, and the difference therebetween was that the copper oxide nanoparticles in Example 1-2 were doped with 0.3 mole % zinc. The final bonding structure in Example 1-2 had a thermal conductivity of 30 W/mK (higher than that of the aluminum oxide substrate), and the heating step of forming the eutectic layer having a thickness of 0.5 μm to 3 μm was performed at a temperature of about 960° C.

Example 1-3

Example 1-3 was substantially similar to Comparative Example 1, and the difference therebetween was that the copper oxide nanoparticles in Example 1-3 were doped with 0.5 mole % zinc. The final bonding structure in Example 1-3 had a thermal conductivity of 30 W/mK (higher than that of the aluminum oxide substrate), and the heating step of forming the eutectic layer having a thickness of 0.5 μm to 3 μm was performed at a temperature of about 960° C. According to a comparison between Comparative Example 1 and Examples 1-1, 1-2, and 1-3, the copper oxide nanoparticles doped with the appropriate amount of zinc efficiently decreased the formation temperature of the eutectic layer without sacrificing the thermal conductivity of the bonding structure.

Example 2-1

Example 2-1 was substantially similar to Comparative Example 1, and the difference therebetween was that the copper oxide nanoparticles in Example 2-1 were doped with 0.1 mole % tin. The final bonding structure in Example 2-1 had a thermal conductivity of 35 W/mK (higher than that of the aluminum oxide substrate), and the heating step of forming the eutectic layer having a thickness of 0.5 μm to 3 μm was performed at a temperature of about 970° C.

Example 2-2

Example 2-2 was substantially similar to Comparative Example 1, and the difference therebetween was that the copper oxide nanoparticles in Example 2-2 were doped with 0.3 mole % tin. The final bonding structure in Example 2-2 had a thermal conductivity of 35 W/mK (higher than that of the aluminum oxide substrate), and the heating step of forming the eutectic layer having a thickness of 0.5 μm to 3 μm was performed at a temperature of about 950° C.

Example 2-3

Example 2-3 was substantially similar to Comparative Example 1, and the difference therebetween was that the copper oxide nanoparticles in Example 2-3 were doped with 0.5 mole % tin. The final bonding structure in Example 2-3 had a thermal conductivity of 30 W/mK (higher than that of the aluminum oxide substrate), and the heating step of forming the eutectic layer having a thickness of 0.5 μm to 3 μm was performed at a temperature of about 950° C. According to a comparison between Comparative Example 1 and Examples 2-1, 2-2, and 2-3, the copper oxide nanoparticles doped with the appropriate amount of tin efficiently decreased the formation temperature of the eutectic layer without sacrificing the thermal conductivity of the bonding structure.

Example 3-1

Example 3-1 was substantially similar to Comparative Example 1, and the difference therebetween was that the copper oxide nanoparticles in Example 3-1 were doped with 0.1 mole % indium. The final bonding structure in Example 3-1 had a thermal conductivity of 34 W/mK (higher than that of the aluminum oxide substrate), and the heating step of forming the eutectic layer having a thickness of 0.5 μm to 3 μm was performed at a temperature of about 980° C.

Example 3-2

Example 3-2 was substantially similar to Comparative Example 1, and the difference therebetween was that the copper oxide nanoparticles in Example 3-2 were doped with 0.1 mole % indium. The final bonding structure in Example 3-2 had a thermal conductivity of 33 W/mK (higher than that of the aluminum oxide substrate), and the heating step of forming the eutectic layer having a thickness of 0.5 μm to 3 μm was performed at a temperature of about 980° C.

Example 3-3

Example 3-3 was substantially similar to Comparative Example 1, and the difference therebetween was that the copper oxide nanoparticles in Example 3-3 were doped with 0.5 mole % indium. The final bonding structure in Example 3-3 had a thermal conductivity of 33 W/mK (higher than that of the aluminum oxide substrate), and the heating step of forming the eutectic layer having a thickness of 0.5 μm to 3 μm was performed at a temperature of about 960° C. According to a comparison between Comparative Example 1 and Examples 3-1, 3-2, and 3-3, the copper oxide nanoparticles doped with the appropriate amount of indium efficiently decreased formation temperature of the eutectic layer without sacrificing the thermal conductivity of the bonding structure.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bonding material, comprising:
   an organic polymer; and
   an inorganic powder dispersed in the organic polymer,
   wherein the organic polymer and the inorganic powder have a weight ratio of 50:50 to 10:90, and
   wherein the inorganic powder comprises copper oxide doped with a dopant, wherein the copper oxide and the dopant have a molar ratio of 99.5:0.5 to 99.9:0.1, and the dopant is zinc, tin, indium, or combinations thereof, and wherein the copper oxide is a compound consisting of copper and oxygen.

2. The bonding material as claimed in claim 1, wherein the organic polymer comprises PVB, PVA, methyl cellulose, or combinations thereof.

3. The bonding material as claimed in claim 1, wherein the inorganic powder has a diameter distribution of 20 nm to 300 nm.

4. A bonding method, comprising:
   bonding a heat dissipation substrate and a copper layer by the bonding material as claimed in claim 1; and
   heating the bonding material, such that the inorganic powder of the bonding material, a part of the heat dissipation substrate, and a part of the copper layer form a eutectic layer.

5. The bonding method as claimed in claim 4, wherein the heat dissipation substrate comprises aluminum oxide, aluminum nitride, or zirconium oxide, and the eutectic layer comprises copper aluminum oxide, copper aluminum oxynitride, or copper zirconium oxide doped with zinc, tin, indium, or combinations thereof.

6. The bonding method as claimed in claim 4, wherein the step of heating the bonding material to form the eutectic layer is performed at a temperature of 950° C. to 1000° C.

7. The bonding method as claimed in claim 4, wherein the step of heating the bonding material to form the eutectic layer is performed under an atmosphere of nitrogen.

8. The bonding method as claimed in claim 4, wherein the step of bonding a heat dissipation substrate and a copper layer by the bonding material comprises printing or spin coating.

* * * * *